(12) United States Patent
Takahashi

(10) Patent No.: US 8,242,615 B2
(45) Date of Patent: Aug. 14, 2012

(54) SEMICONDUCTOR CHIP ON FILM PACKAGE WITH DUMMY PATTERNS AND MANUFACTURING METHOD THEREOF

(75) Inventor: Yoshikazu Takahashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 184 days.

(21) Appl. No.: 12/017,687

(22) Filed: Jan. 22, 2008

(65) Prior Publication Data

US 2008/0203563 A1  Aug. 28, 2008

(30) Foreign Application Priority Data

Feb. 27, 2007  (JP) .................................. 2007-47847

(51) Int. Cl.
*H01L 23/544* (2006.01)
(52) U.S. Cl. ........ 257/797; 257/737; 257/783; 257/787; 257/E23.179; 438/926
(58) Field of Classification Search .................. 257/737, 257/797, 666, 676, 692, 691, 787, 668, 701, 257/671, 673, 926, 783, 777, 780, 690, 735, 257/E23.179, E23.023, E21.502; 438/926
See application file for complete search history.

(56) References Cited

U.S. PATENT DOCUMENTS

| | | | | |
|---|---|---|---|---|
| 3,346,774 A | * | 10/1967 | Brady | 361/760 |
| 5,022,580 A | * | 6/1991 | Pedder | 228/56.3 |
| 5,804,882 A | * | 9/1998 | Tsukagoshi et al. | 257/783 |
| 5,949,137 A | * | 9/1999 | Domadia et al. | 257/712 |
| 6,355,981 B1 | * | 3/2002 | Richards et al. | 257/735 |
| 6,486,565 B2 | * | 11/2002 | Miyako | 257/797 |
| 6,555,925 B1 | * | 4/2003 | Higashi et al. | 257/797 |
| 6,617,521 B1 | * | 9/2003 | Saito et al. | 174/260 |

(Continued)

FOREIGN PATENT DOCUMENTS

JP  11121886 A  *  4/1999

OTHER PUBLICATIONS

Kenji Toyosawa, Nakae Nakamura, Kazuhiko Fukuta, Yasunori Chikawa; COF (Chip-on-Film) Technology for LCD ICs using Reel-to-Reel Systems; Sharp Technical Journal; No. 3 (Aug. 2001); Special Papers; p. 1-4.*

*Primary Examiner* — N Drew Richards
*Assistant Examiner* — John P Dulka
(74) *Attorney, Agent, or Firm* — Taft Stettinius & Hollister LLP

(57) ABSTRACT

A COF package in exemplary form includes a flexible base film, inner leads each made of metal and having a thickness d1, which are disposed at a peripheral edge of a semiconductor chip-mounted predetermined spot on the base film and protruded into the semiconductor chip-mounted predetermined spot, dummy patterns having a thickness d2 (<(d1+d3), where d3 is the thickness of the electrodes), which are disposed at predetermined positions within the semiconductor chip-mounted predetermined spot, a semiconductor chip, and an encapsulating resin. The semiconductor chip has a plurality of the electrodes each protruded into a main surface thereof and having the thickness d3. The electrodes are bonded to the inner leads respectively. Further, the encapsulating resin is charged between the base film and the semiconductor chip. The shape and/or position of the dummy patterns may mark the function of one or more inner leads.

27 Claims, 7 Drawing Sheets

U.S. PATENT DOCUMENTS

| | | | |
|---|---|---|---|
| 6,683,369 B2 | 1/2004 | Iwamoto | |
| 6,710,458 B2 * | 3/2004 | Seko | 257/778 |
| 6,809,406 B2 * | 10/2004 | Yoshiike et al. | 257/668 |
| 6,841,462 B2 | 1/2005 | Iwamoto | |
| 6,853,086 B1 * | 2/2005 | Nakayama | 257/778 |
| 7,193,328 B2 * | 3/2007 | Suzuki et al. | 257/778 |
| 7,208,840 B2 * | 4/2007 | Yuzawa | 257/777 |
| 7,514,802 B2 * | 4/2009 | Tetani et al. | 257/797 |
| 7,547,979 B2 * | 6/2009 | Jung et al. | 257/797 |
| 7,825,529 B2 * | 11/2010 | Horii | 257/797 |
| 7,928,591 B2 * | 4/2011 | Chen | 257/797 |
| 2001/0013170 A1 * | 8/2001 | Gamel et al. | 29/834 |
| 2002/0043704 A1 * | 4/2002 | Seko | 257/678 |
| 2003/0006509 A1 * | 1/2003 | Suzuki et al. | 257/778 |
| 2003/0047805 A1 * | 3/2003 | Farnworth et al. | 257/723 |
| 2003/0075795 A1 * | 4/2003 | Hashimoto | 257/723 |
| 2005/0009219 A1 * | 1/2005 | Yuzawa | 438/15 |
| 2005/0023648 A1 * | 2/2005 | Jung et al. | 257/620 |
| 2005/0133940 A1 * | 6/2005 | Chen et al. | 257/797 |
| 2005/0173802 A1 * | 8/2005 | Tabara et al. | 257/758 |
| 2007/0096314 A1 * | 5/2007 | Funakoshi | 257/737 |
| 2009/0303482 A1 * | 12/2009 | Levinski et al. | 356/400 |

* cited by examiner

SEMICONDUCTOR CHIP ON FILM PACKAGE WITH DUMMY PATTERNS AND MANUFACTURING METHOD THEREOF

CROSS-REFERENCE TO RELATED APPLICATIONS

This application is a claims priority under 35 U.S.C. §119 to Japanese Patent Application Serial No. JP2007-047847 filed on Feb. 27, 2007, entitled "SEMICONDUCTOR PACKAGE AND MANUFACTURING METHOD THEREOF," the disclosure of which is hereby incorporated by reference.

RELATED ART

1. Field of the Invention

The present invention includes a semiconductor package equipped with a semiconductor chip such as a semiconductor integrated circuit (hereinafter called ("IC") chip and a manufacturing method thereof, and particularly to a chip on film (hereinafter called "COF") package in which a semiconductor chip is packaged on a base film by flip-chip bonding (hereinafter called "F/C") techniques, and a manufacturing method thereof.

2. Brief Discussion of Related Art

FIGS. 14 and 15 are schematic views illustrating a structure of a conventional semiconductor package (e.g., COF package. The COF package has a band-like flexible (i.e., flexibility-existing) base film 1 with film advance sprockets 1a and 1b formed on both sides of the base film 1 at predetermined intervals.

A predetermined semiconductor chip-mounting location 2 is provided substantially centered between the sprockets 1a and 1b. A plurality of inner leads 3, each made of metal and having a thickness d1, are disposed at the peripheral edge of the semiconductor chip-mounting location 2. Tips or leading ends of these inner leads 3 protrude into the semiconductor chip-mounting location 2, with metallic conductive leads 4 being provided at corresponding rear ends of the inner leads 3. A plurality of input terminals 5 disposed on one side are connected to the inner leads 3 by way of the conductive leads 4, and a plurality of output terminals 6 disposed on the opposite side are connected to corresponding inner leads 3 via the conductive leads 4. In order to protect the conductive leads 4, a solder resist 7 is coated onto the conductive leads 4.

A semiconductor chip 10 is packaged or mounted on the semiconductor chip-mounting location 2 by F/C techniques. That is, a plurality of bump electrodes 11, each having a thickness d3 (which is incidentally greater than thickness d1), are provided on a main surface of the semiconductor chip 10 and brought into alignment. Heat and loads are applied to the bump electrodes 11 to join or bond them to their corresponding inner leads 3. A molten sealing or encapsulating resin 12 is provided between the semiconductor chip-mounting location 2 and main surface of the semiconductor chip 10 from the sides of the semiconductor chip 10 to seal and protect between the semiconductor chip-mounting location 2 and main surface of the semiconductor chip 10. Furthermore, the side surfaces of the semiconductor chip 10 are also covered and protected with the molten encapsulating resin 12. Thereafter, the molten resin 12 is solidified.

This type of COF package is suitable for a size reduction, thinning, an improvement in accuracy, an improvement in capacity and the like. The COF package has, however, such a malfunction as shown in FIG. 16, by way of example.

FIG. 16 is a vertical sectional view at the time that distortion occurs in the base film 1 in FIG. 14. In the COF package shown in FIGS. 14 and 15, the central part of the base film 1 is flexed upward as shown in FIG. 16 by way of example due to material lots and variations in manufacturing condition or the like. The flexed base film 1 is attached to the main surface of the semiconductor chip 10 and hence the encapsulating resin 12 is not reliably charged, thus resulting in the occurrence of its unfilled failure.

INTRODUCTION TO THE INVENTION

A semiconductor package of the present invention may comprise a base film, a plurality of inner leads each made of metal and having a thickness d1, which are disposed at a peripheral edge of a semiconductor chip-mounted predetermined spot provided over the base film and are protruded into the semiconductor chip-mounted predetermined spot; dummy patterns each made of metal and having a thickness d2 (<(d1+d3, where d3: thickness of each bump electrode), which are disposed at predetermined positions lying within the semiconductor chip-mounted predetermined spot and electrically isolated from the inner leads; a semiconductor chip having a plurality of the bump electrodes each protruded onto a main surface thereof and having the thickness d3, which semiconductor chip is disposed over the semiconductor chip-mounted predetermined spot and has the bump electrodes joined to the inner leads respectively; and an encapsulating resin charged between the semiconductor chip-mounted predetermined spot and the main surface of the semiconductor chip.

Incidentally, the encapsulating resin may be charged into even the peripheral edge side of the main surface of the semiconductor chip.

A method for manufacturing the semiconductor package of the above invention may comprise the steps of selectively forming the plurality of inner leads at the peripheral edge of the semiconductor chip-mounted predetermined spot provided over the base film and simultaneously selectively forming the dummy patterns at predetermined positions lying within the semiconductor chip-mounted predetermined spot; bringing the plurality of bump electrodes protruded into the main surface of the semiconductor chip into alignment to bond the bump electrodes to the inner leads respectively; implanting a molten encapsulating resin between the semiconductor chip-mounted predetermined spot and the main surface of the semiconductor chip from the peripheral edge side of the main surface of the semiconductor chip to seal between the semiconductor chip-mounted predetermined spot and the main surface of the semiconductor chip; and solidifying the molten encapsulating resin.

Incidentally, the peripheral edge side of the main surface of the semiconductor chip may also be sealed in the sealing step.

It is a first aspect of the present invention to provide a semiconductor package comprising: (a) a base film; (b) inner leads disposed on the base film, the inner leads at least partially defining a semiconductor chip mounting location on the base film; (c) dummy patterns disposed on the base film and within the semiconductor chip mounting location, the dummy patterns being electrically isolated from the inner leads; (d) a semiconductor chip including bump electrodes protruding from a main surface thereof, the semiconductor chip positioned proximate the semiconductor chip mounting location, where at least one of the electrodes is joined to at least one of the inner leads; and (e) an encapsulating resin interposing the base film and the main surface of the semiconductor chip, wherein at least one of a position and a shape of at least one of the dummy patterns is a functional marker for at least one of the inner leads.

In a more detailed embodiment of the first aspect a peripheral side of the main surface of the semiconductor chip is sealed by the encapsulating resin. In yet another more detailed embodiment, a mean thickness of the inner leads is d1, a mean thickness of the dummy patterns is d2, and a mean thickness of the electrodes is d3, where the sum of d1 and d3 is greater than d2. In a further detailed embodiment, the dummy patterns may include at least two dummy patterns having different shapes, each of the different-shaped dummy patterns being a functional marker for at least one of the inner leads.

It is a second aspect of the present invention to provide a method for manufacturing a semiconductor package comprising: (a) forming inner leads to at least partially define a semiconductor chip mounting location on a base film and, simultaneously to the formation of the inner leads, forming dummy patterns within the semiconductor chip mounting location; (b) bonding electrodes protruding from a main surface of a semiconductor chip with at least a portion of the inner leads; (c) delivering a resin between the base film and the semiconductor to form a seal between base film and the semiconductor chip; and (d) solidifying the resin; wherein the act of forming the dummy patterns within the semiconductor chip mounting location includes forming at least one dummy pattern having at least one of a position and a shape that corresponds to at least one of the inner leads.

In a more detailed embodiment of the second aspect, the method further comprises delivering the resin to a peripheral edge of the semiconductor chip to seal off the peripheral edge. In yet another more detailed embodiment, the act of forming dummy patterns within the semiconductor chip mounting location includes forming at least two dummy patterns having distinguishable shapes corresponding, respectively, to at least two inner leads having differing functions.

It is a third aspect of the present invention to provide a semiconductor package comprising: (a) a semiconductor chip including electrodes mounted to electrical leads, the electrical leads mounted to a film; (b) at least one dummy pattern interposing the semiconductor chip and the film; and (c) a sealing resin interposing the base film and the main surface of the semiconductor chip, where the dummy pattern inhibits direct contact between the semiconductor chip and the film; and wherein a function of a proximate lead of the electrical leads is identifiable using a position of the at least one dummy pattern.

In a more detailed embodiment of the third aspect, a peripheral side of the semiconductor chip is sealed by the sealing resin. In yet another more detailed embodiment, an average thickness of the electrical leads is d1, a thickness of the dummy pattern is d2, and an average thickness of the electrodes is d3, where the sum of d1 and d3 is greater than d2. In a further detailed embodiment, the function of the proximate lead may be identifiable using a shape of the at least one dummy pattern. In still a further detailed embodiment, the at least one dummy pattern may include at least two dummy patterns, each of the at least two dummy patterns having a shape, the shapes being different from each other, each shape identifying a function of a respective at least one of the inner leads.

It is a fourth aspect of the present invention to provide a semiconductor package comprising: (a) a semiconductor chip including electrodes mounted to electrical leads, the electrical leads being mounted to a film; (b) at least one dummy pattern interposing the semiconductor chip and the film; and (c) a scaling resin interposing the base film and the semiconductor chip; wherein the at least one dummy pattern inhibits direct contact between the semiconductor chip and the film; and wherein the at least one dummy pattern is shaped to designate a function of at least one of the inner leads.

In a more detailed embodiment of the fourth aspect, a peripheral side of the semiconductor chip is sealed by the sealing resin. In yet another more detailed embodiment, an average thickness of the electrical leads is d1, a thickness of the dummy pattern is d2, and an average thickness of the electrodes is d3, where the sum of d1 and d3 is greater than d2. In a further detailed embodiment, a position of the at least one dummy pattern designates a function of at least one of the inner leads. In still a further detailed embodiment, the at least one dummy pattern includes at least two dummy patterns, each of the at least two dummy patterns having a shape, the shapes being different from each other, each shape designating a function of at least one of the inner leads.

It is a fifth aspect of the present invention to provide a semiconductor package comprising: (a) a semiconductor chip mounted to a plurality of electrical leads, the electrical leads mounted to a film; (b) at least two dummy patterns cooperating to define a passageway that interposes the semiconductor chip and the film; and (c) a sealing resin interposing the base film and the main surface of the semiconductor chip, the sealing resin occupying at least a portion of the passageway; wherein at least one of a location and a shape of the at least one of the dummy patterns denotes a function of a particular one of the electrical leads.

In a more detailed embodiment of the fourth aspect, a peripheral side of the semiconductor chip is sealed by the sealing resin. In yet another more detailed embodiment, an average thickness of the electrical leads is d1, a thickness of the dummy pattern is d2, and an average thickness of the electrodes is d3, where the sum of d1 and d3 is greater than d2. In a further detailed embodiment, a location of at least one of the dummy patterns denotes the function of the particular one of the electrical leads. In still a further detailed embodiment, a shape of at least one of the dummy patterns denotes the function of the particular one of the electrical leads. In still a further detailed embodiment, at least two of the dummy patterns each have a shape, the shapes being different from each other, each shape denoting the function of at least one of the electrical leads.

It is a sixth aspect of the present invention to provide a semiconductor package comprising: (a) a base film; (b) inner leads disposed on the base film, the inner leads at least partially defining a semiconductor chip mounting location on the base film; (c) dummy patterns interposed between the semiconductor chip and the base film, the dummy patterns being electrically isolated from the inner leads; (d) a semiconductor chip including electrodes protruding from a main surface thereof, the semiconductor chip positioned proximate the semiconductor chip mounting location, where at least one of the electrodes is joined to at least one of the inner leads; and (c) an encapsulating resin interposing the base film and the main surface of the semiconductor chip; wherein at least one of a position and a shape of at least one of the dummy patterns is a functional marker for at least one of the inner leads.

DETAILED DESCRIPTION

The exemplary embodiments of the present invention are described and illustrated below to encompass semiconductor packages equipped with a semiconductor chip such as a semiconductor integrated circuit (hereinafter called ("IC") chip, as well as methods for manufacturing the same, including a chip on film (hereinafter called "COF") package in which a semiconductor chip is packaged on a base film by flip-chip bonding (hereinafter called "F/C") techniques. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

Figure 1:
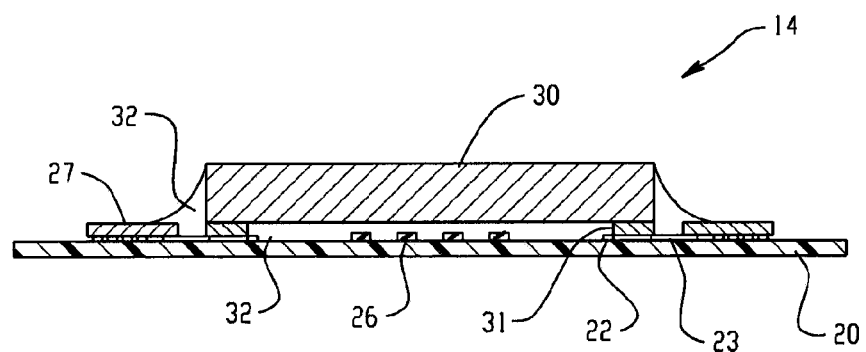
FIGS. 1 and 2 are sectional and plan views of a first exemplary structure of a semiconductor package (e.g., COF package) in accordance with the present invention.
Figure 2:
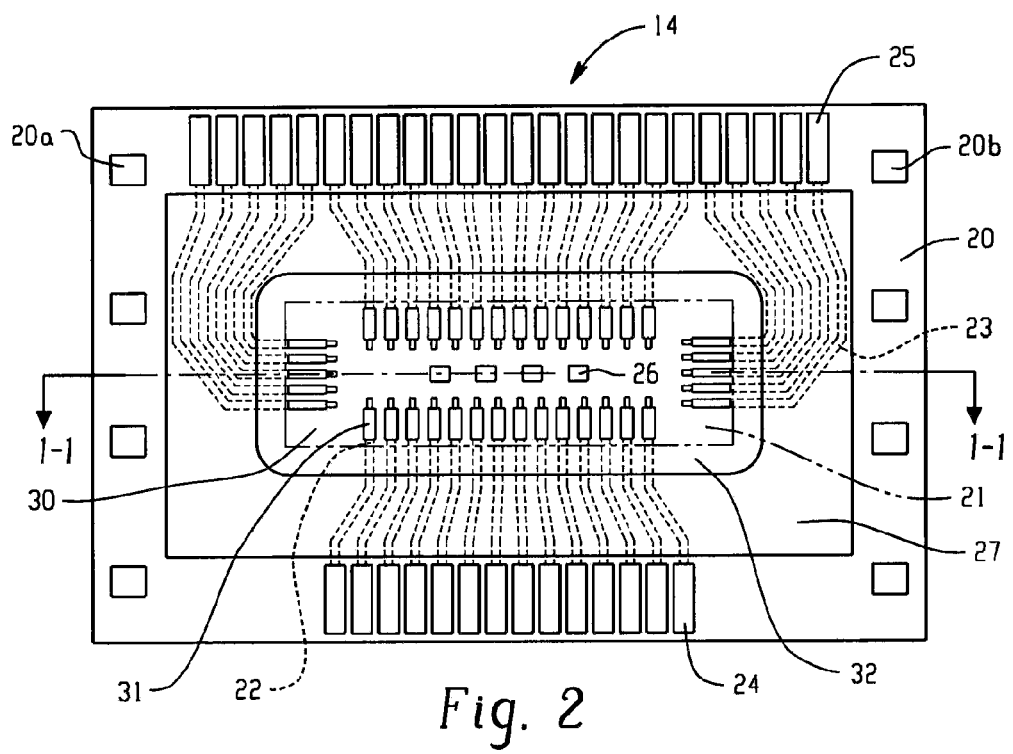

Referencing FIGS. 1 and 2, a semiconductor package (e.g., COF package) 14 according to a first exemplary embodiment of the present invention includes a band-like flexible base film 20 formed of an insulative polyimide resin (e.g., polyimide glass epoxy) that is heat resistant and/or chemical resistant, as well as having appropriate mechanical strength. Holes or dimples 20a and 20b are formed on both sides of the base film 20 at predetermined intervals to receive a sprocket (not shown) for repositioning the film 20.

A rectangular semiconductor chip-mounting location 21 is provided substantially equidistant between the holes 20a and 20b located on both sides of the film 20. A plurality of inner leads 22, each made of a conductive material (e.g., copper foil, aluminum foil or gold foil or the like) and having a thickness d1 (ranging from about 8 μm to 10 μm, for example), are disposed at the peripheral edge of the semiconductor chip-mounting location 21. The tips or leading ends of these inner leads 22 are positioned within the semiconductor chip-mounting location 21. Conductive pathways 23, which extend from respective the inner leads 22 to a series of input terminals 24 and output terminals 25, are likewise fabricated from a conductive material. Each of the series of input terminals 24 is disposed on one side of the semiconductor chip-mounting location 21, while all of the output terminals 25 are disposed on an opposite side of the semiconductor chip-mounting location 21.

A plurality of dummy patterns 26 are provided within semiconductor chip-mounting location 21 between the inner leads 22, but electrically isolated from each of the inner leads 22. Each dummy pattern 26 is fabricated from a conductive material and includes a thickness d2, where d2 is less than the aggregate thicknesses of d1 and d3. In exemplary form, the plurality of dummy patterns 26 are formed at positions near the center of the semiconductor chip-mounting location 21 where flexion of the film 20 is relatively large within the semiconductor chip-mounting location 21. In addition, or in the alternative, the dummy patterns 26 may be formed at positions that will not substantially retard the flow of molten resin. As will be described later, the semiconductor chip-mounting location 21 and the plurality of conductive leads 23 disposed between the plurality of input terminals 24 and the plurality of output terminals 25 are eventually covered with an insulating protective film (e.g., solder resist) 27.

For purposes of this exemplary embodiment, the plurality of dummy patterns 26 are linearly arranged substantially in the center of the semiconductor chip-mounting location 21, where each dummy pattern is spaced away from an adjacent dummy pattern. Moreover, the exemplary dummy patterns 26 are shaped to exhibit substantially rectangular cross-sections taken horizontally with respect to a vertical axis extending through the dummy patterns.

Referring again to FIGS. 1 and 2, a semiconductor chip 30, such as a rectangularly shaped integrated circuit chip, is mounted to the film 20 at the semiconductor chip-mounting location 21 using flip-chip techniques. That is, a plurality of bump electrodes 31 each having a thickness d3 are provided on a main surface of the semiconductor chip 30, which is thereafter brought into alignment with the semiconductor chip-mounting location 21. Heat, loads, and the like are applied indirectly to the bump electrodes 31 to join or bond the electrodes to their corresponding inner leads 22. Subsequently, a molten sealing or encapsulating resin 32 is injected between the semiconductor chip 30 and the film 20 to seal and protect those features between the film and the main surface of the semiconductor chip. Incidentally, the side surfaces of the semiconductor chip 30 may also be covered and protected with the encapsulating resin 32. Thereafter, the encapsulating resin 32 is solidified.

In use, when a signal is inputted from a corresponding input terminal 24, the input signal is supplied to the semiconductor chip 30 via its corresponding conductive lead 23, inner lead 22 and bump electrode 31. In doing so, a predetermined electrical process is performed by the semiconductor chip 30 and the result of its process is outputted to its corresponding output terminal 25 through a corresponding bump electrode 31, inner lead 22 and conductive lead 23.

The following explanation is an exemplary process for fabricating the semiconductor package (e.g., COF package) 14. In a first exemplary phase, the band-like base film 20 is formed with holes 20a and 20b having a predetermined width at both ends thereof. The entire surface of the base film 20 is then coated with a metal film to achieve a thickness d1, and thereafter selectively etched using photolithography technology to form the plurality of inner leads 22, the plurality of conductive paths 23, the plurality of output terminals 25, and the plurality of dummy patterns 26.

A solder resist 27 is selectively coated onto portions of the plurality of conductive leads 23 at a second exemplary phase, which are exposed on the periphery of the semiconductor chip-mounting location 21, to protect the plurality of conductive leads 23.

A plurality of bump electrodes 31 each having a thickness d3 are prepared on a main surface the semiconductor chip 30 during a third exemplary phase. The semiconductor chip 30 is thereafter brought into alignment with the semiconductor chip-mounting location 21 of the base film 20. Alignment, in this sense, means that the plurality of bump electrodes 31 of the semiconductor chip 30 are positioned under corresponding tips or leading ends of the plural inner leads 22. Then, for example, heat loads and the like are applied by known flip-chip techniques to join the bump electrodes 31 to the inner leads 22 respectively. It is to be understood, however, that the formation of the bump electrodes 31 on the main surface the semiconductor chip 30 may be carried out at any time preceding this third exemplary phase and need not be carried out just prior to joining the chip 30 and the elements mounted to the film 20.

Molten encapsulating resin 32 is delivered between the semiconductor chip-mounting location 21 and the semiconductor chip main surface surrounded by the solder resist 27 from the peripheral edge side of the main surface of the semiconductor chip 30 in a fourth exemplary phase. In doing so, the molten encapsulating resin passes between the respective inner leads 22, between the respective dummy patterns 26 and between the upper ends of the dummy patterns 26 and the semiconductor chip main surface and is charged between the semiconductor chip-mounting location 21 and the semiconductor chip main surface, whereby the encapsulating resin 32 forms a seal between the semiconductor chip-mounting location 21 and the semiconductor chip main surface. If the amount of molten resin to be delivered is increased during this fourth exemplary phase, then the side surfaces of the semiconductor chip 32 may also be sealed, thereby providing adequate or perfect sealing.

Presuming the film 20 includes a plurality of semiconductor chips 30 mounted thereon at predetermined intervals, a cutting operation is carried out in a fifth exemplary phase after the molten resin 32 has solidified to generate a plurality of COF packages 14.

Figure 3:
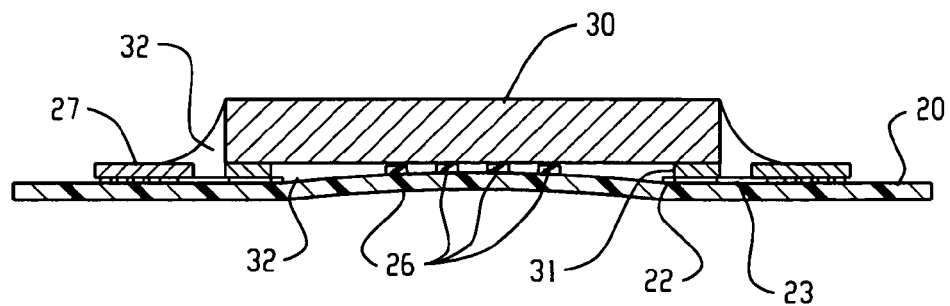
FIG. 3 is a sectional view of the semiconductor package at the time that distortion occurs in a base film 20 in FIG. 1.

Referring again to FIGS. 1-3, the plurality of dummy patterns 26 each have a thickness d2, which is less than the aggregate thicknesses d1 of an inner lead 22 and d3 of a bump electrodes 31. Therefore, even though the central part of the base film 20 may become flexed upward as shown in FIG. 3, which may be the result of variations in material lots and manufacturing conditions or the like, the dummy patterns 26 act as buffers and hence the base film 20 does not adhere to the semiconductor chip 30 main surface. Therefore, the base film 20 may be free to return to its original flat state due to an elastic restoring force of the flexible base film 20. As a result, the occurrence of a resin-uncharged failure in the resin sealing step is reduced, if not avoided all together, and each COF package 14 can be manufactured at high yields.

In addition, since the plurality of dummy patterns 26 each have a thickness d2, which is less than the aggregate thicknesses (d1+d3) of an inner lead 22 and the bump electrode 31, the implanted molten resin 32 can pass between the upper ends of the dummy patterns 26 and the semiconductor chip 30 main surface during the resin sealing step and evenly flow between the chip 30 and chip-mounting location 21. Thus, it is possible to shorten the encapsulating time and prevent the occurrence of incomplete resin filling during the resin sealing step.

Figure 4:
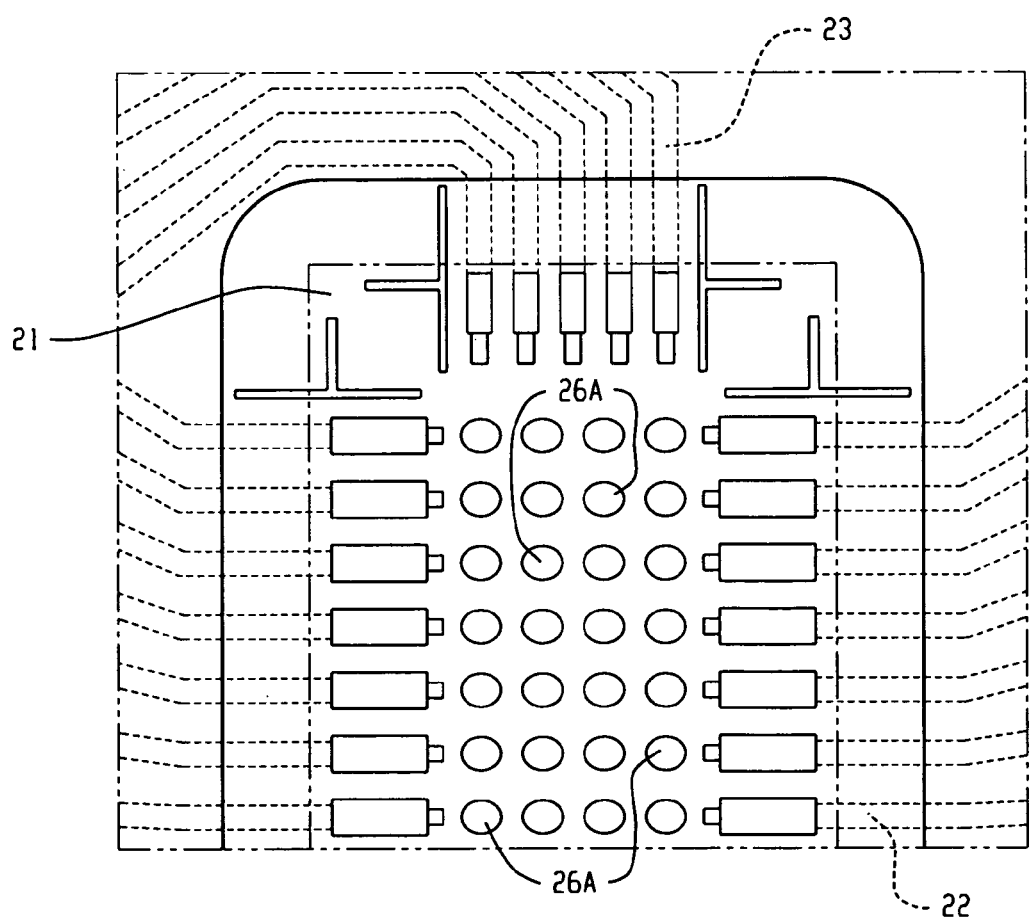
FIG. 4 is a plan view showing part of FIG. 3 indicative of another partial packaging example in see-through form.

Referring to FIG. 4, the plurality of dummy patterns 26A may have a circular cross-section and be disposed at certain positions so as not to substantially retard the flow of the injected molten resin 32 during the resin sealing step. In this alternate exemplary embodiment, the dummy patterns 26A are generally cylindrical and have a diameter of approximately 0.3 mm and a height of approximately 0.5 mm to 0.6 mm. Using dummy patterns 26A that are circular in cross-section results in shorter encapsulation time during the resin injection step and reduces the incidence of incomplete resin filling between the chip 30 and chip-mounting location 21. Moreover, even disbursement of the dummy patterns 26A allows more efficient dissipation of heat generated at the semiconductor chip 30, which is radiated into the base film 20 via the large number of dummy patterns 26A.

Figure 5:
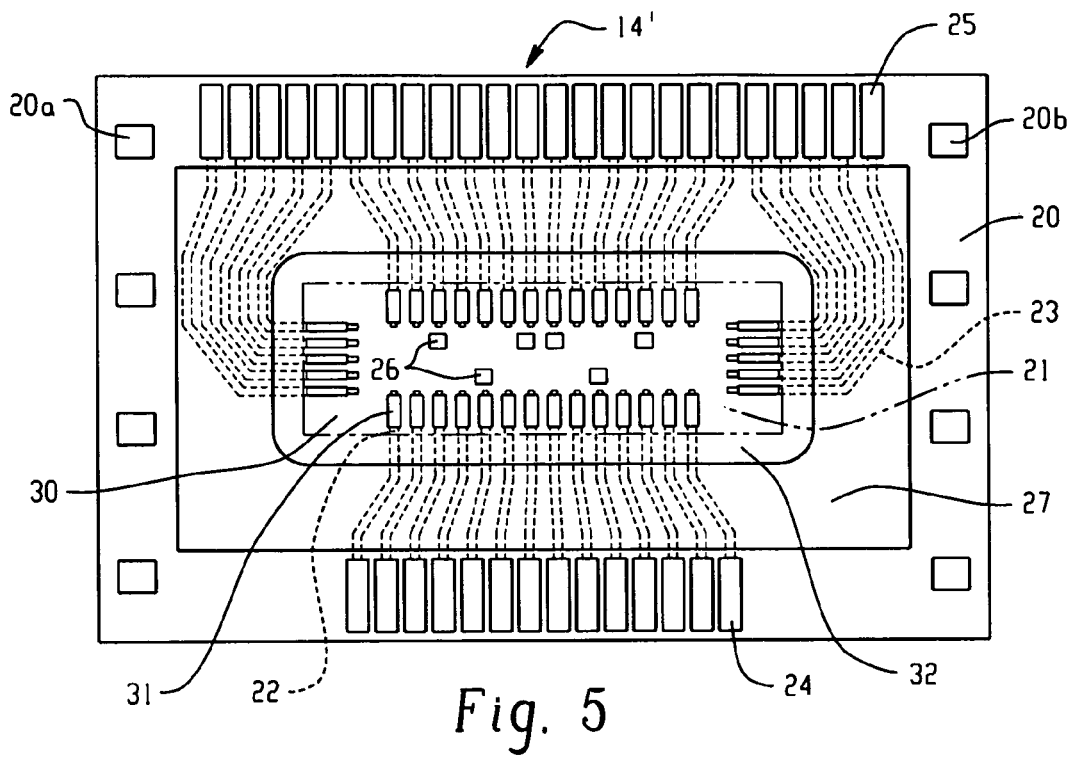
FIG. 5 is a schematic plan view illustrating part of a structure of a semiconductor package (e.g., COF package) according to a second exemplary embodiment of the present invention in see-through form.

Referencing FIG. 5, a semiconductor package (e.g., COF package) 14' according to a second exemplary embodiment of the present invention includes a plurality of dummy patterns 26 having substantially rectangular horizontal cross-sections in a horizontal plane. These dummy patterns 26 are formed inside a rectangle of inner leads 22 that partially defines the semiconductor chip-mounting location 21.

The COF package has inner leads 22 ranging from about a few hundred of pins to a few thousands of pins, for example. Because it is generally not possible to determine at a glance which inner lead 22 corresponds to a specific lead function, the dummy patterns 22 are arranged in front of the specific inner leads 22 to specify the functions of the pins simply by appearance. Therefore, it is not only possible to eliminate an unfilled failure due to the attachment of the base film 20 and the semiconductor chip main surface on each other, but it is also possible to specify the pin numbers of the inner leads 22. Thus, the corresponding pin can be detected or found out quickly upon a failure analysis. This second exemplary embodiment is similar to the first exemplary embodiment in substantially all other configuration and manufacturing method. Thus, only for purposes of brevity are these configurations and manufacturing methods being omitted.

Figure 6:
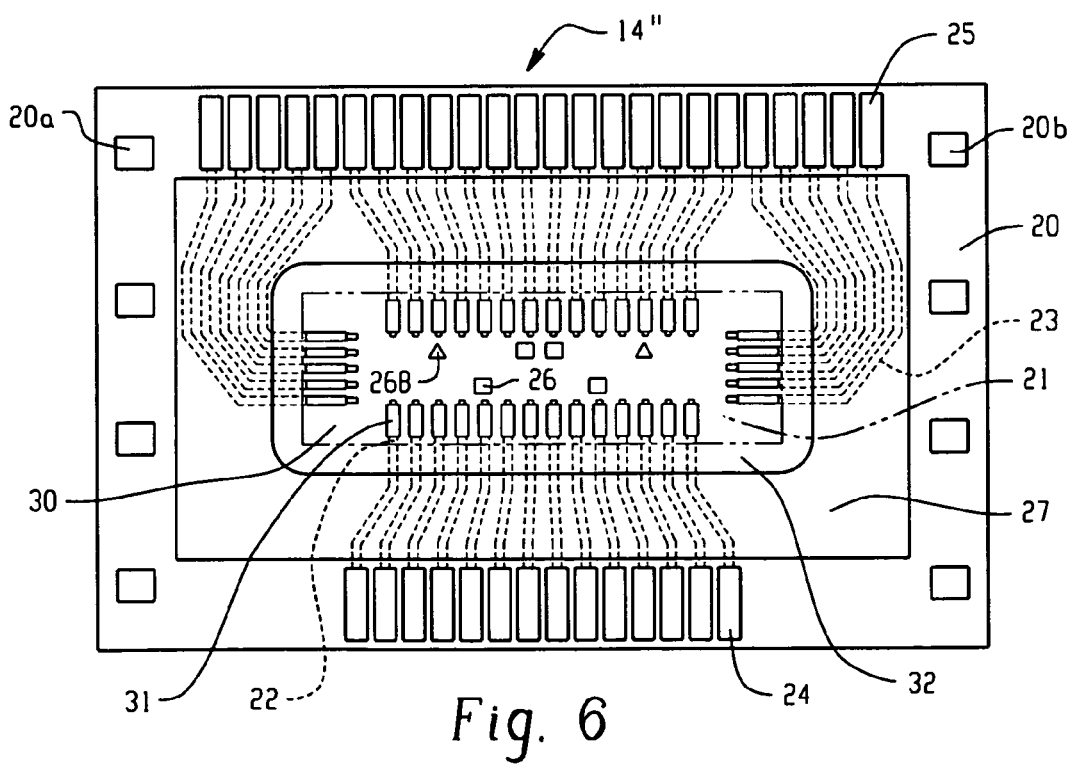
FIG. 6 is a schematic plan view showing part of a structure of a semiconductor package (e.g., COF package) according to a third exemplary embodiment of the present invention in see-through form.
Figure 7:
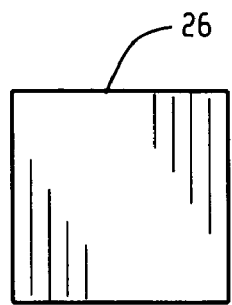
FIGS. 7-12 are plan views illustrating examples of dummy patterns different in planar form.
Figure 8:
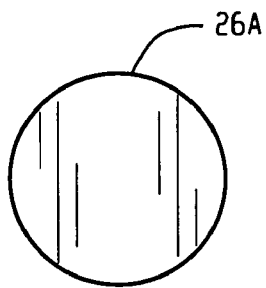
Figure 9:
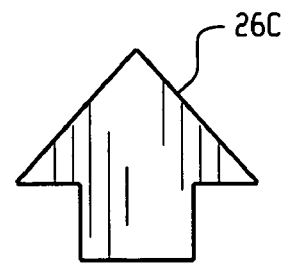
Figure 10:
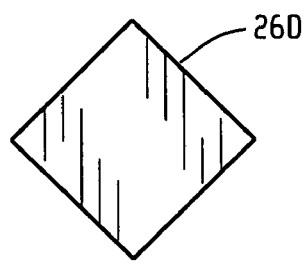
Figure 11:
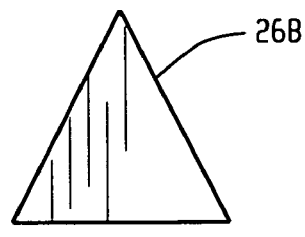
Figure 12:
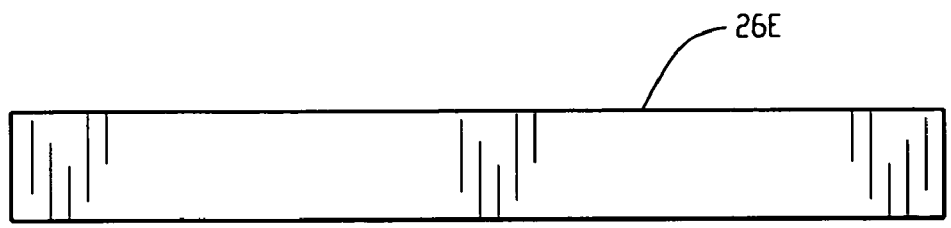

Referring to FIG. 6, a semiconductor package (e.g., COF package) 14" according to a third exemplary embodiment of the present invention includes a plurality of shaped dummy patterns 26 (e.g., square-shaped and triangular dummy patterns 26B). These dummy patterns 26, 26B are formed inside a rectangle of inner leads 22 that partially defines the semiconductor chip-mounting location 21.

The COF package 14" has inner leads 22 ranging from about a few hundred of pins to a few thousands of pins, for example. Because it is generally not possible to determine at a glance which inner lead 22 corresponds to a specific lead function, the dummy patterns 26, 26B are arranged in front of the specific inner leads 22 to specify the functions of the pins simply by appearance, distinguishing between square and triangular dummy patterns. Therefore, it is not only possible to eliminate an unfilled failure due to the attachment of the base film 20 and the semiconductor chip main surface on each other, but it is also possible to specify the pin numbers of the inner leads 22. Thus, the corresponding pin can be detected or found out quickly upon a failure analysis. This third exemplary embodiment is similar to the first exemplary embodiment in substantially all other configuration and manufacturing method. Thus, only for purposes of brevity are these configurations and manufacturing methods being omitted.

Referencing to FIGS. 7-12, a semiconductor package (e.g., COF package) in accordance with the present invention may include dummy patterns of various shapes, where the particular shape of the dummy pattern is used to denote specific lead functions. For example, the dummy pattern may include a square shape (see FIG. 7), a circular shape (see FIG. 8), an arrow-shape (see FIG. 9), a diamond shape (see FIG. 10), a triangular shape (see FIG. 11), and a linear-shape (see FIG. 12). In view of the foregoing disclosure, those skilled in the art will understand that other shapes may be used to denote specific lead functions.

Figure 13:
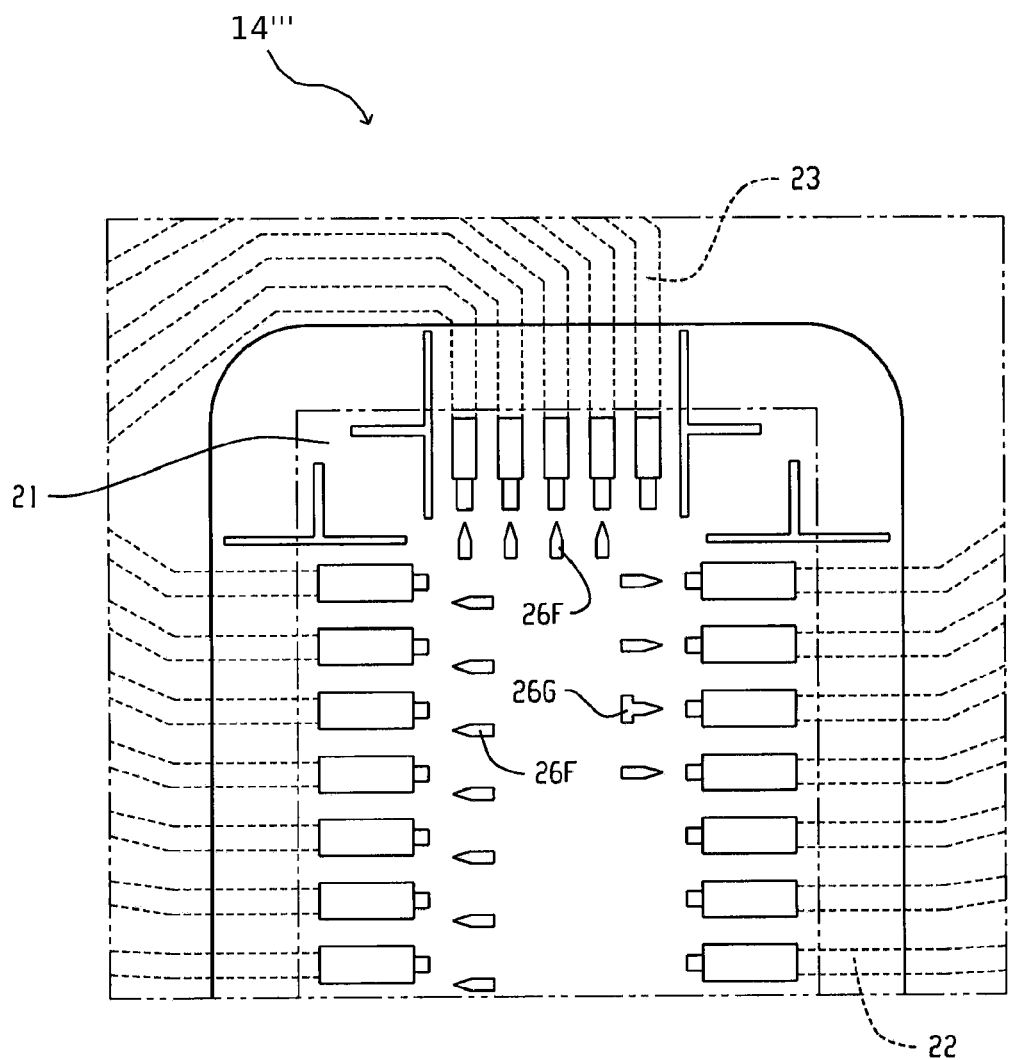
FIG. 13 is a plan view showing, in see-through form, a partial packaging example of a COF package using the dummy patterns such as those shown in FIGS. 7-12.
Figure 14:
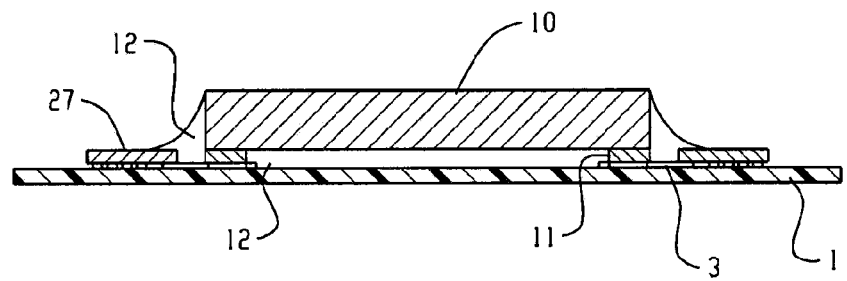
FIGS. 14 and 15 are sectional and plan views of a conventional semiconductor package (e.g., COF package)
Figure 15:
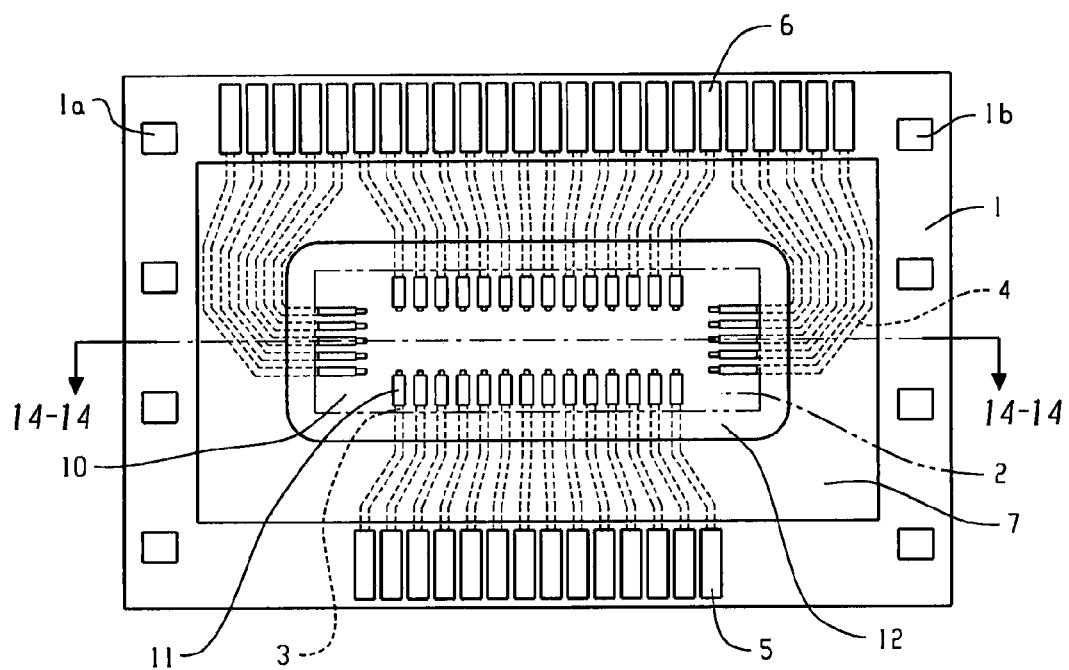
Figure 16:
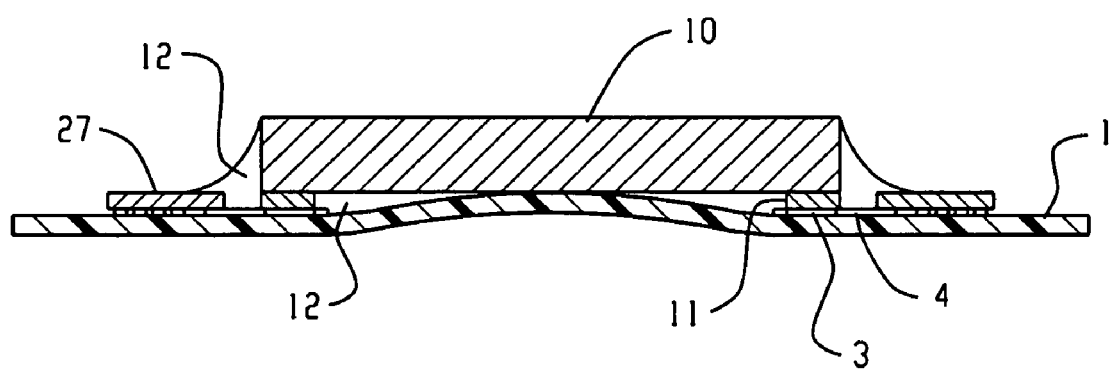
FIG. 16 is a vertical sectional view of the conventional semiconductor package at the time that distortion occurs in a base film in FIGS. 14 and 15.

Referring to FIG. 13, a semiconductor package (e.g., COF package) 14''' in accordance with the present invention may include dummy patterns of various shapes, where the dummy patterns are not disposed in front of the inner leads 22 provided on the input terminal side, but dummy patterns 26F, 26G or the like are disposed and formed in front of other specific plural inner leads 22.

Generally, the position and/or the shape of any of the dummy patterns may be used as a marker for one or more of the leads such that the particular lead is identifiable. By locating a dummy pattern in a particular location and/or forming it in a particular shape, the function of one or more leads, such as a nearest inner lead, may be denoted. Leads having different functions may be identified by dummy patterns having different shapes, for example.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A semiconductor package comprising:
    a base film;
    inner leads disposed on the base film, the inner leads at least partially defining a semiconductor chip mounting location on the base film;
    encoded dummy patterns disposed on the base film in an asymmetric configuration within the semiconductor chip mounting location, the dummy patterns being electrically isolated from the inner leads;
    a semiconductor chip including electrodes protruding from a main surface thereof, the semiconductor chip positioned proximate the semiconductor chip mounting location, where at least one of the electrodes is joined to at least one of the inner leads; and
    an encapsulating resin interposing the base film and the main surface of the semiconductor chip;
    wherein at least one of a position and a shape of at least one of the dummy patterns is a functional marker for at least one of the inner leads, and at least one of the dummy patterns is arranged in front of at least one of the inner leads in the semiconductor chip mounting location to specify a pin number of the at least one of the inner leads.

2. The semiconductor package of claim 1, wherein a peripheral side of the main surface of the semiconductor chip is sealed by the encapsulating resin.

3. The semiconductor package of claim 1, wherein:
    a mean thickness of the inner leads is d1;
    a mean thickness of the dummy patterns is d2; and
    a mean thickness of the electrodes is d3;
    where the sum of d1 and d3 is greater than d2.

4. The semiconductor package of claim 1, wherein the dummy patterns include at least two dummy patterns having different shapes, each of the different-shaped dummy patterns being a functional marker for at least one of the inner leads.

5. The semiconductor package of claim 1, wherein the encoded dummy patterns are not disposed in front of the inner leads provided on an input terminal side, but other dummy patterns are disposed and formed in front of other specific plural inner leads.

6. A method for manufacturing a semiconductor package comprising:
    forming inner leads to at least partially define a semiconductor chip mounting location on a base film and, simultaneously to the formation of the inner leads, forming a first encoded dummy pattern opposite at least one of the inner leads within the semiconductor chip mounting location, and forming a second encoded dummy pattern opposite at least another one of the inner leads within the semiconductor chip mounting location;
    bonding electrodes protruding from a main surface of a semiconductor chip with at least a portion of the inner leads;
    delivering a resin between the base film and the semiconductor chip to form a seal between the base film and the semiconductor chip; and
    solidifying the resin;
    wherein the act of forming the encoded dummy patterns includes forming the first dummy pattern having at least one of a position and a shape that corresponds to a function of at least one of the inner leads, and forming the second dummy pattern in front of at least one of the inner leads to specify a pin number of at least one of the inner leads.

7. The method of claim 6, further comprising the step of delivering the resin to a peripheral edge of the semiconductor chip to seal off the peripheral edge.

8. The method of claim 6, wherein the act of forming dummy patterns within the semiconductor chip mounting location includes forming at least two dummy patterns having distinguishable shapes corresponding, respectively, to at least two inner leads having differing functions.

9. A semiconductor package comprising:
    a semiconductor chip including electrodes mounted to electrical leads, the electrical leads mounted to a film;
    at least one encoded dummy pattern interposing the semiconductor chip and the film; and
    a scaling resin interposing the base film and the semiconductor chip;
    wherein the at least one dummy pattern inhibits direct contact between the semiconductor chip and the film; and
    wherein a function and a pin number of a proximate lead of the electrical leads is identifiable using the at least one dummy pattern.

10. The semiconductor package of claim 9, wherein a peripheral side of the semiconductor chip is sealed by the sealing resin.

11. The semiconductor package of claim 9, wherein:
    an average thickness of the electrical leads is d1;
    a thickness of the dummy pattern is d2; and
    an average thickness of the electrodes is d3;
    where the sum of d1 and d3 is greater than d2.

12. The semiconductor package of claim 9, wherein the function of the proximate lead is identifiable using a shape of the at least one dummy pattern.

13. The semiconductor package of claim 12, wherein:
    the at least one dummy pattern includes at least two dummy patterns, each of the at least two dummy patterns having a shape, the shapes being different from each other, each shape identifying a function of a respective at least one of the inner leads.

14. A semiconductor package comprising:
a semiconductor chip including electrodes mounted to electrical leads, the electrical leads being mounted to a film;
a plurality of encoded dummy patterns interposing the semiconductor chip and the film; and
a sealing resin interposing the base film and the semiconductor chip;
wherein the plurality of encoded dummy patterns inhibit direct contact between the semiconductor chip and the film; and
wherein a first of the plurality of encoded dummy patterns has a first shape designating a pin number of at least one of the inner leads; and,
wherein a second of the plurality of encoded dummy patterns has a second shape, different than the first shape; designating a function of at least another of the inner leads.

15. The semiconductor package of claim 14, wherein a peripheral side of the semiconductor chip is sealed by the sealing resin.

16. The semiconductor package of claim 14, wherein:
an average thickness of the electrical leads is d1;
a thickness of the dummy pattern is d2; and
an average thickness of the electrodes is d3;
where the sum of d1 and d3 is greater than d2.

17. The semiconductor package of claim 14, wherein a position of the at least one dummy pattern designates a function of at least one of the inner leads.

18. The semiconductor package of claim 14, wherein the at least one dummy pattern includes at least two dummy patterns, each of the at least two dummy patterns having a shape, the shapes being different from each other, each shape designating a function of at least one of the inner leads.

19. A semiconductor package comprising:
a semiconductor chip mounted to a plurality of electrical leads, the electrical leads mounted to a film;
at least three encoded dummy patterns arranged asymmetrically and cooperating to define a passageway that interposes the semiconductor chip and the film; and
a sealing resin interposing the base film and the main surface of the semiconductor chip, the sealing resin occupying at least a portion of the passageway;
wherein a shape of at least one of the three encoded dummy patterns denotes a function of at least one of the electrical leads and a different shape of at least another of the three encoded dummy patterns specifics a pin number of another one of the electrical leads.

20. The semiconductor package of claim 19, wherein a peripheral side of the semiconductor chip is sealed by the sealing resin.

21. The semiconductor package of claim 19, wherein the semiconductor chip is mounted to the electrical leads using electrodes and:
an average thickness of the electrical leads is d1;
a thickness of the dummy pattern is d2; and
an average thickness of the electrodes is d3;
where the sum of d1 and d3 is greater than d2.

22. The semiconductor package of claim 19, wherein a location of at least one of the dummy patterns denotes the function of the particular one of the electrical leads.

23. The semiconductor package of claim 19, wherein a shape of at least one or the dummy patterns denotes the function of the particular one of the electrical leads.

24. The semiconductor package of claim 23, wherein at least two of the dummy patterns each have a shape, the shapes being different from each other, each shape denoting the function of at least one of the electrical leads.

25. A semiconductor package comprising:
a base film;
inner leads disposed on the base film, the inner leads at least partially defining a semiconductor chip mounting location on the base film;
encoded dummy patterns interposed between the semiconductor chip and the base film; the dummy patterns being electrically isolated from the inner leads;
a semiconductor chip including electrodes protruding from a main surface thereof, the semiconductor chip positioned proximate the semiconductor chip mounting location, where at least one of the electrodes is joined to at least one of the inner leads; and
an encapsulating resin interposing the base film and the main surface or the semiconductor chip;
wherein the encoded dummy patterns are arranged asymmetrically and a first shape of at least one of the encoded dummy patterns is a functional marker and a second shape of at least another of the encoded dummy patterns is a marker to specify a pin number for at least another of the inner leads.

26. A method of identifying an inner lead of a semiconductor package, the method comprising:
forming inner leads at least partially defining a semiconductor chip mounting location on a base film;
forming an encoded dummy pattern within the semiconductor chip mounting location; and,
using at least one of shape and position of the encoded dummy pattern to specify at least one of function and pin number for at least one of the inner leads.

27. A method of using an encoded dummy pattern within a semiconductor chip mounting location of a semiconductor package, the method comprising:
using at least one of a shape of the encoded dummy pattern and a position of the encoded dummy pattern to specify at least one of a function and a pin number for at least one of a plurality of inner leads at least partially defining a semiconductor chip mounting location on a base film of a semiconductor package.

* * * * *